United States Patent
Chen (10) Patent No.: US 12,002,660 B2
(45) Date of Patent: Jun. 4, 2024

(54) SEMICONDUCTOR MANUFACTURING CHAMBER WITH PLASMA/GAS FLOW CONTROL DEVICE

(71) Applicant: Taiwan Semiconductor Manufacturing Company, Hsinchu (TW)

(72) Inventor: Chien-Liang Chen, New Taipei (TW)

(73) Assignee: Taiwan Semiconductor Manufacturing Company, LTD., Hsinchu (TW)

( * ) Notice: Subject to any disclaimer, the term of this patent is extended or adjusted under 35 U.S.C. 154(b) by 0 days.

(21) Appl. No.: 17/671,646

(22) Filed: Feb. 15, 2022

(65) Prior Publication Data
US 2023/0260763 A1 Aug. 17, 2023

(51) Int. Cl.
*H01J 37/32* (2006.01)
*H01L 21/3065* (2006.01)

(52) U.S. Cl.
CPC .. *H01J 37/32642* (2013.01); *H01J 37/32082* (2013.01); *H01J 37/3244* (2013.01); *H01L 21/3065* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 6,308,654 B1 | 10/2001 | Schneider et al. | |
| 10,704,146 B2* | 7/2020 | Oki | C23C 16/46 |
| 2003/0201069 A1* | 10/2003 | Johnson | H01J 37/32082 |
| | | | 156/345.43 |
| 2010/0061517 A1 | 3/2010 | Allen et al. | |
| 2019/0333784 A1* | 10/2019 | Lin | H01J 37/32715 |
| 2021/0285892 A1 | 9/2021 | Raj et al. | |

FOREIGN PATENT DOCUMENTS

TW 202205916 A 2/2022

* cited by examiner

*Primary Examiner* — Stephanie P Duclair
(74) *Attorney, Agent, or Firm* — Lippes Mathias LLP (57) ABSTRACT

A method of plasma etching a semiconductor wafer includes: securing the semiconductor wafer to a mounting platform within a process chamber such that an outer edge of the semiconductor wafer is encircled by a sloped annular ring having a plurality of perforation therein, the sloped annular ring having an inner edge at a first end of the sloped annular ring and an outer edge at a second end of the sloped annular ring. Suitably, the first end is opposite the second end and the first end resides in a first plane and the second end resides in a second plane different from the first plane. The method further includes generating a plasma within the process chamber such that the semiconductor wafer is exposed to the plasma and creating a flow of at least one of plasma and gas through the perforations in the sloped annular ring.

20 Claims, 5 Drawing Sheets

SEMICONDUCTOR MANUFACTURING CHAMBER WITH PLASMA/GAS FLOW CONTROL DEVICE

BACKGROUND

The following relates to the semiconductor manufacturing arts, and in particular, to a method and apparatus for controlling a plasma/gas flow in a semiconductor manufacturing chamber during etching and/or other suitable manufacturing processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features as shown in the accompany figures may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "left," "right," "side," "back," "rear," "behind," "front," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, in some suitable embodiments disclosed herein, a manufacturing tool and/or process chamber for the manufacturing and/or processing of semiconductor devices is described. In some embodiments, the manufacturing tool or process chamber may be an etching, deposition, doping, or other like tool or part of a system and has a plasma and/or gas flow control device (also referred to as an exhaust ring) encircling and/or surrounding a mounting platform which holds a semiconductor wafer being processed. In some suitable embodiments, the mounting platform may comprise and/or include an electrostatic, vacuum or other suitable chuck that selectively secures and/or holds in place the semiconductor wafer being processed.

In some suitable embodiments, the plasma and/or gas flow control device is a perforated and sloped annular plate or ring that acts and/or serves to control a plasma and/or gas flow through, and/or stabilize the pressure within, the process chamber during the etching or other suitable semiconductor manufacturing step or process being performed on the semiconductor wafer.

In some suitable embodiments, the sloped annular plate or ring from which the plasma and/or gas flow control device is formed has an inner radius measured from, for example, a central vertical axis. The inner radius defines and/or establishes an inner edge, periphery and/or circumference of the sloped annular plate or ring. The sloped annular plate or ring from which the plasma and/or gas flow control is formed also has an outer radius which is also measured from, for example, the central vertical axis. The outer radius defines and/or establishes an outer edge, periphery and/or circumference of the sloped annular plate or ring. Suitably, the outer radius is greater than the inner radius. In some suitable embodiments, the outer edge, periphery and/or circumference of the sloped annular plate or ring lies within, defines and/or otherwise establishes a lower plane; and the inner edge, periphery and/or circumference of the sloped annular plate or ring lies within, defines and/or otherwise establishes an upper plane, which is off-set, for example, in a direction of the central vertical axis, from the lower plane. That is to say, the inner edge, periphery and/or circumference of the sloped annular plate or ring in not co-planar with the outer edge, periphery and/or circumference of the sloped annular plate or ring.

In some suitable embodiments, the sloped annular plate or ring from which the plasma and/or gas flow control device is formed generally has the shape of an outer surface of a frustrum, for example, a right frustrum or a parallel truncation of a right circular cone having an axis that is essentially coextensive with the aforementioned central vertical axis. Accordingly (for example, as can be seen when viewed in a bisecting cross-section), the sloped annular plate or ring deflects or is angled downward (for example, in a direction of the vertical central axis) when progressing radially from the inner edge, periphery and/or circumference of the sloped annular plate or ring toward the outer edge, periphery and/or circumference of the sloped annular plate or ring.

It is to be appreciated that during plasma etching and/or other similar semiconductor manufacturing processes certain unwanted or undesired particles or contaminates can be created and/or otherwise introduced in the process chamber where the process is being performed on the semiconductor wafer. For example, etch products such as, without limitation, FCN, $CO_x$ (where x is in a range of about 1 to about 2), $SiCl_x$ (where x is in a range of about 1 to about 4), $SiF_x$ (where x is in a range of about 1 to about 4), etc. may be created or otherwise introduced into the process chamber. If not sufficiently vented out of the process chamber or suitably removed or otherwise kept off the semiconductor wafer, such unwanted or undesired particles or contaminants run the risk of causing damage to and/or defects in the semiconductor wafer, for example, should they land and/or remain on a surface of the semiconductor wafer being processed. During plasma etching and the like, the potential for unwanted particles and/or contaminates landing and/or remaining on the surface of the semiconductor wafer can be particularly high and/or realized at the edge or periphery region of the semiconductor wafer. As a result of unwanted particles and/or contaminates landing and/or remaining on the surface of the semiconductor wafer being processed, wafer acceptance testing (WAT) and/or chip probe (CP) metrology can be negatively impacted.

Therefore, in accordance with some suitable embodiments, one advantage of the downwardly angled or otherwise sloped annular plate or ring forming the plasma and/or gas flow control device described herein is that it lessens and/or guards against the landing and/or retention of unwanted particles or contaminants on the surface of a semiconductor wafer being plasma etched or otherwise processed in the process chamber, for example, as compared, to etching chambers and/or methods that employ substantially, horizontally planar plasma and/or gas flow control devices that are arranged co-planar with and/or parallel to the surface of the semiconductor wafer being processed, which etching chambers and/or methods can tend to induce or encourage the deflection and/or sputtering of unwanted particles and/or contaminates back onto the surface of the semiconductor wafer being processed.

Figure 1:
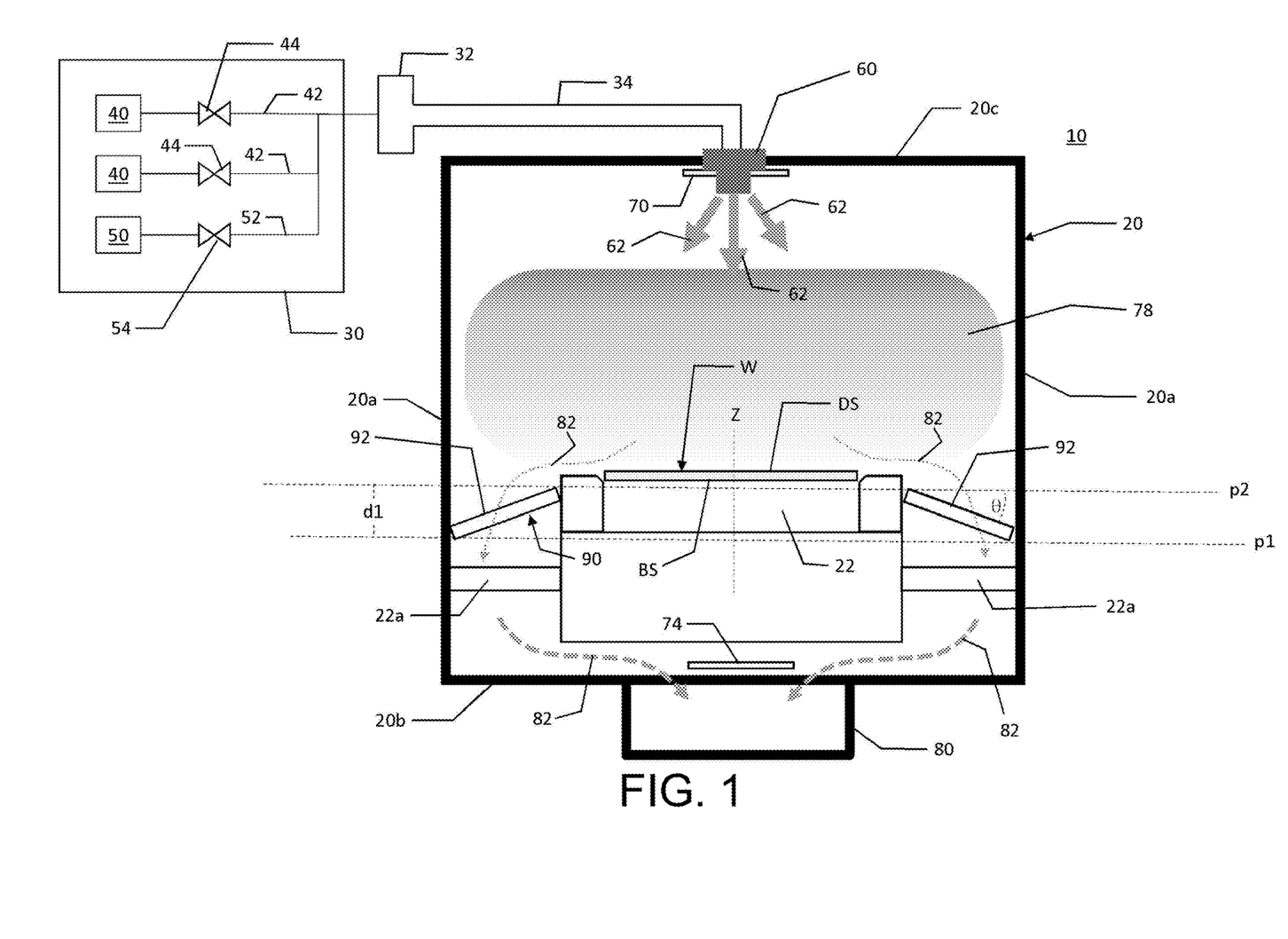
FIG. 1 diagrammatically illustrates a cross section view of a semiconductor manufacturing tool and/or process chamber in accordance with some embodiments disclosed herein.

In accordance with some embodiments disclosed herein, FIG. 1 is a diagrammatic illustration showing an essentially bisecting cross-section of an exemplary semiconductor manufacturing tool 10, for example, used for plasma etching and/or other like processing of a semiconductor wafer W. As shown, the semiconductor manufacturing tool 10 includes a process chamber 20 in which a semiconductor manufacturing process is conducted on the semiconductor wafer W, for example, without limitation, plasma etching or the like. The semiconductor wafer W may, for example, without limitation, comprise a silicon wafer, silicon-on-insulator (SOI) wafer, gallium arsenide (GaAs) wafer, or so forth. Optionally, the semiconductor wafer W may have one or more continuous and/or patterned layers, three-dimensional (3D) structures (e.g., FinFET or gate-all-around, GAA, transistors, etc.), or so forth disposed on the semiconductor wafer W, and optionally the etching or other processing performed using the tool 10 may be used to etch or otherwise process such a layer, 3D structure, or so forth. This is still referred to herein as processing the semiconductor wafer W.

In practice, the semiconductor manufacturing tool 10 may be used to etch a surface of the semiconductor wafer W (or a layer or 3D structure thereon) by placing the semiconductor wafer W into the processing chamber 20 and selectively securing it therein atop a mounting platform 22. In some embodiments, the semiconductor manufacturing tool 10 is operatively coupled to a delivery system 30 that may deliver, for example, one or more gaseous etchants, to the process chamber 20. Optionally, the delivery system 30 supplies the various desired etchants to the process chamber 20 through a controlled delivery inlet 32 and/or a manifold 34. In some embodiments, the delivery system 30 may also help to control the flow rate of the etchant or etchants into the process chamber 20 by controlling the flow and pressure of a carrier gas through the delivery system 30. Optionally, the delivery system 30 is controlled by a controller 100, which controls and regulates the introduction of various etchants and carrier gases to the process chamber 20, as well as operating and/or controlling various components of the semiconductor manufacturing tool 10. See, for example, FIG. 5. In some embodiments, the etching process performed in the process chamber 20 of the semiconductor manufacturing tool 10 may be, without limitation, a plasma etching process, a reactive-ion etching (RIE) process, a deep reactive-ion etching (DRIE) process, another suitable plasma and/or gas flow process, or the like.

In some suitable embodiments, the delivery system 30 may include a plurality of etchant supplies 40, along with a carrier gas supply 50. For illustrative purposes herein, only two etchant supplies 40 are illustrated in FIG. 1. This is done merely for simplicity and/or clarity herein. In practice, it should be appreciated that any suitable number of etchant supplies 40 may be included, such as one etchant supply for each etchant desired to be used within the process chamber 20 of the semiconductor manufacturing tool 10. For example, in an embodiment in which five separate etchants will be utilized, there may be five etchant supplies 40.

In practice, each of the etchant supplies 40 may be a vessel, such as a gas storage bottle or tank, that is located either locally with respect to the semiconductor processing tool 10 or remotely from the semiconductor processing tool 10. In another embodiment, the etchant supplies 40 may be part of a facility that independently prepares and delivers the desired etchants. Any suitable source for the desired etchants may be utilized as the etchant supplies 40, and all such sources are fully intended to be included within the scope of the embodiments disclosed herein. Suitably, each of the etchant supplies 40 supply an etchant to the controlled delivery inlet 32 through respective lines 42, for example, controlled with respective valves 44. In some suitable embodiments, the valves 44 may be controlled (i.e., selectively opened and/or closed) by the controller 100.

A carrier gas supply 50 may supply a desired carrier gas, or diluent gas, that may be used to help push or "carry" the various desired etchants to the process chamber 20. The carrier gas may be an inert gas or other gas that does not react with the etchant itself or with by-products from the etchant's reactions.

The carrier gas supply 50, or diluent supply, may be a vessel, such as a gas storage tank, that is located either locally with respect to the semiconductor processing tool 10 or remotely from the semiconductor processing tool. In another embodiment, the carrier gas supply 50 may be a facility that independently prepares and delivers the carrier gas to the semiconductor processing tool 10. Any suitable source for the carrier gas may be utilized as the carrier gas supply 50, and all such sources are fully intended to be included within the scope of the embodiments disclosed herein. The carrier gas supply 50 may supply the desired carrier gas to the semiconductor processing tool 10 through a line 52 with a valve 54 that connects the carrier gas supply 50 to the lines 42. In some suitable embodiments, the valve 54 may also controlled by the controller 100 that controls and regulates the introduction of the various etchants and carrier gases to the semiconductor processing tool 10. Suitably, once combined, the lines may be directed towards the controlled inlet 32, for a controlled entry into the process chamber 20 through the manifold 34.

In some suitable embodiments, one or more of the etchant supplies 40 may be separately connected to the controlled inlet 32 through the lines 42 having valves 44. The carrier gas supply 50 may also optionally be connected separately to the controlled delivery inlet 32 through the line 52 having the valve 54. In this manner, etchants from the etchant supplies 40 and the carrier gas from the carrier gas supply 50 may be selectively supplied to the controlled delivery inlet 32 individually, in combination, or in sequence. Etchants and the carrier gas may be combined in the controlled delivery inlet 32 before being supplied to the manifold 34.

In some suitable embodiments, for example, without limitation, the carrier gas may be nitrogen ($N_2$), helium (He), argon (Ar), combinations of these, or the like, although other suitable carrier gases may be utilized. More generally, suitable etch gases and/or carrier gases, include, without limitation: $C_xH_yF_z$ (where x, y and/or z are each in a range of about 0 to about 6); He; Ar; $F_2$; $Cl_2$; $O_2$; $N_2$; $H_2$; HBr; HF; $NF_3$; $SF_6$; other oxygen or fluorine-bearing gas or chlorine-based etch gas; combinations thereof; and/or the like.

In some suitable embodiments, the process chamber 20 may be any desired shape suitable for dispersing the etchant and contacting the etchant with the semiconductor wafer W. In the embodiment illustrated in FIG. 1, the process chamber 20 has, for example, a cylindrical sidewall 20a and a bottom wall or floor 20b. However, the process chamber 20 is not limited to a cylindrical shape, and any other suitable shape, such as a hollow square tube, an octagonal shape, or the like, may be utilized. Furthermore, the process chamber 20 may be surrounded by a housing made of material that is inert to the various process materials. As such, although the process chamber housing may be any suitable material that can withstand the chemistries and pressures involved in the etching process, in some suitable embodiments the process chamber housing may be steel, stainless steel, nickel, aluminum, alloys of these, combinations of these, and the like.

As shown in FIG. 1, an inlet port 60 (also referred to as a showerhead) is arranged and/or positioned within the process chamber 20, for example, at a top end or top wall 20c thereof. In some suitable embodiments, the inlet port or showerhead 60 receives the various etchants and/or gases from the manifold 34 and helps to disperse the same into the process chamber 20. In practice, the inlet port or showerhead 60 may be designed to evenly disperse the etchants in order to help minimize unwanted process conditions that may arise from uneven dispersal. In some embodiments, the inlet port or showerhead 60 may have a circular design with evenly distributed openings therein to allow for the dispersal of the supplied etchants and/or gases into the process chamber 20. However, any suitable method of introducing the supplied etchants and/or gases may be utilized.

In some suitable embodiments, the mounting platform 22 is also arranged and/or positioned within the process chamber 20, for example, supported therein by one or more support members 22a extending from the sidewall 20a of the process chamber 20. Generally, the mounting platform 22 serves to position, hold and/or control the semiconductor wafer W within the process chamber 20 during processing. Suitably, the semiconductor wafer W being processed is a disk including a top or device side and/or surface DS and a bottom or back side and/or surface BS opposite the device side/surface DS. In practice, one or more individual semiconductor devices, for example, such as, without limitation, integrated circuits (ICs), metal-oxide-semiconductor field-effect transistors (MOSFETs), fin field-effect transistors (FinFETs), gate-all-around field-effect transistors (GAAFETs) or other suitable transistors, other semiconductor structures, and/or the like, are carried and/or formed on the device side DS of the semiconductor wafer W.

In practice, the back side BS of the semiconductor wafer W may be a substantially planar surface. Suitably, when loaded into the process chamber 20 of the semiconductor manufacturing tool 10, the semiconductor wafer W is mounted, secured and/or held on the mounting platform 22 on the back side BS of the semiconductor wafer W, i.e., with the back side BS of the semiconductor wafer W facing the mounting platform 22. Accordingly, the opposite device side or surface DS of the semiconductor wafer W faces upward or otherwise toward the top wall 20c of the process chamber 20 or toward the inlet port or showerhead 60. In some embodiments, the mounting platform 22 may selectively hold the semiconductor wafer W using electrostatic forces, clamps, vacuum pressure, combinations of these, or the like, and may also optionally include heating and cooling mechanisms in order to regulate a temperature of the semiconductor wafer W during processing. In practice, the mounting platform 22 may comprise and/or include an electrostatic, vacuum, mechanical or other suitable chuck. Optionally, the mounting platform 22 may also be a rotary platform that enables rotation of the semiconductor wafer W about its axis during the wafer processing to improve spatial uniformity.

In some suitable embodiments, the semiconductor processing tool 10 may be equipped with an electrode 70 coupled to a radio frequency (RF) generator 72 (see, for example, FIG. 5), for use as a plasma generator. As shown, the electrode 70 may be housed in the process chamber 20 and/or be arranged on, in or proximate the top wall 20c of the process chamber 20, for example, around, about and/or near the inlet port or showerhead 60. In some suitable embodiments, the plasma generator may be a transformer coupled plasma generator and may be, for example, a coil. Suitably, the RF generator 72 selectively provides power to the electrode 70 (for example, under control of the controller 100) in order to ignite the plasma during introduction of the reactive etchants into the process chamber 20.

Although the electrode 70 is described above as a capacitively coupled plasma generator, embodiments are not intended to be limited to a capacitively coupled plasma generator. Rather, any suitable method of generating the plasma, such as inductively coupled plasma systems, magnetically enhanced reactive ion etching, electron cyclotron resonance, a remote plasma generator, or the like, may be utilized. All such methods are fully intended to be included within the scope of the embodiments.

In some suitable embodiments, a second lower electrode 74, operatively coupled to a second RF generator 76 (see, for example, FIG. 5), may also be included, for example, housed in the process chamber 20. For illustrative purposes herein, as shown in FIG. 1, the second lower electrode 74 is arranged on, in or proximate a bottom wall or floor 20b of the process chamber 20. However, in practice, the second lower electrode the second lower electrode 74 may be arranged and/or located elsewhere as appropriate, for example, proximate to the mounting platform 22. In some suitable embodiments, the second lower electrode 74 is electrically biased by the second RF generator 76 (for example, under control of the controller 100) at a RF voltage during the etching process. By being electrically biased, the second lower electrode 74 may be used to provide a bias to the incoming etchants and assist to ignite them into a plasma. The second lower electrode 74 may also be utilized to maintain the plasma during the etching process by maintaining the bias, and also to help accelerate ions from the plasma towards the semiconductor wafer W. As a further variant (not shown), the two electrodes 70, 74 may be connected to respective positive and negative (or respective negative and positive terminals) of a single RF generator. Although not shown, it is also contemplated to apply a d.c. voltage in the chamber 20 via the electrodes 70, 74 or dedicated d.c. bias terminals.

In some suitable embodiments, the process chamber 20 may be operatively connected to a vacuum or other like pump 80, for example, as shown in FIG. 1 at or proximate the bottom wall or floor 20c of process chamber 20. In practice, the vacuum pump 80 may be under the control of the controller 100 and may be utilized to control the pressure within the process chamber 20 to a desired pressure. Additionally, once the etching process is completed, the vacuum pump 80 may be utilized to evacuate the process chamber 20 and/or flow nitrogen or another purge gas through the chamber in preparation for removal or unloading of the semiconductor wafer W.

As shown in FIG. 1, the process chamber 20 also houses and/or includes therein a plasma and/or gas flow control device 90 (also referred to as an exhaust ring). In some suitable embodiments, the plasma and/or gas flow control device 90 comprises and/or includes a perforated and sloped annular plate or ring 92, for example, that encircles and/or surrounds the mounting platform 22 which holds the semiconductor wafer W being processed. Suitably, the plasma and/or gas flow control device 90 acts and/or serves to regulate and/or otherwise control the plasma and/or gas flow through the process chamber 20, and/or to stabilize the pressure within the process chamber 20, for example, during the etching or other suitable semiconductor manufacturing step or process being performed on the semiconductor wafer W.

Figure 2:
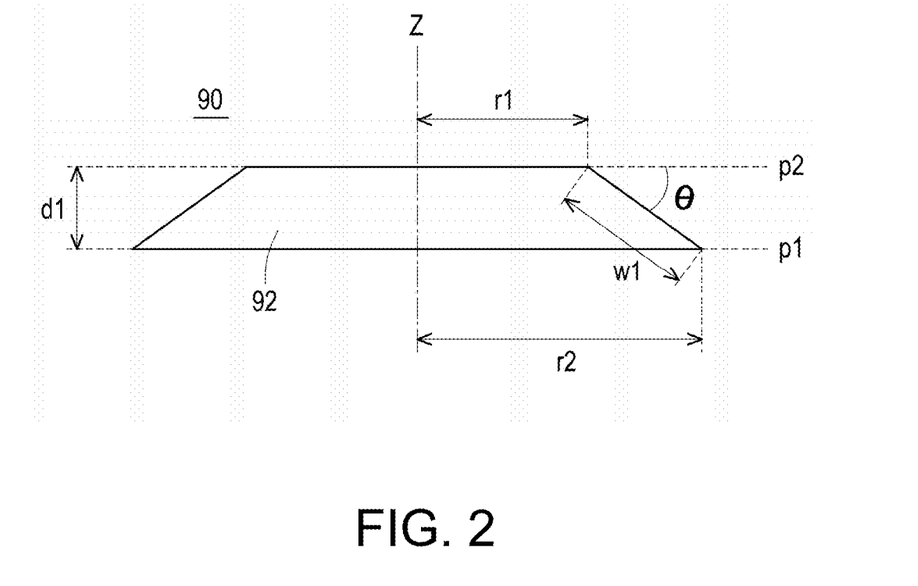
FIG. 2 diagrammatically illustrates a side elevation view of a plasma and/or gas flow control device in accordance with some embodiments disclosed herein.
Figure 3:
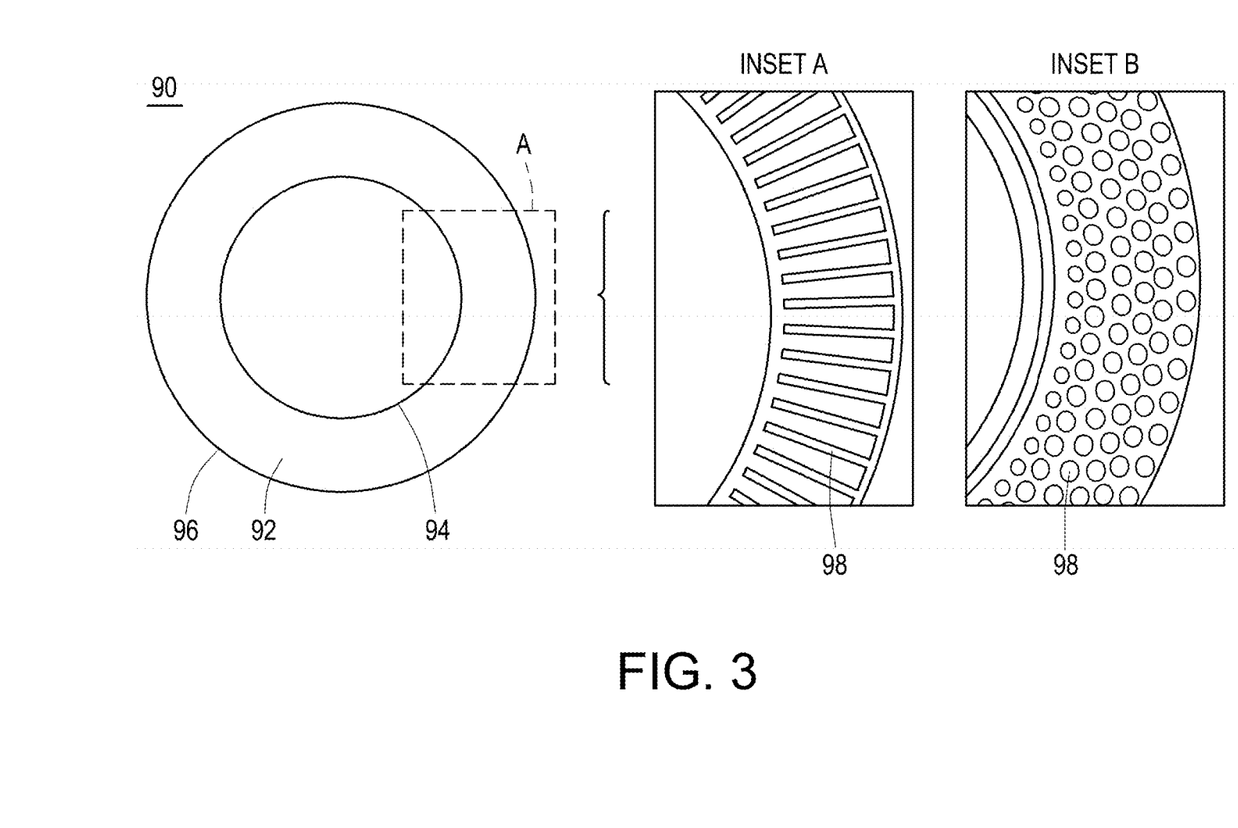
FIG. 3 diagrammatically illustrates a top plan view of the plasma and/or gas flow control device shown in FIG. 2. Insets A and B are enlargements of a region A shown in FIG. 3, the insets diagrammatically illustrating exemplary configurations of perforations in a sloped annular plate and/or ring forming the plasma and/or gas flow control device according to some suitable embodiments disclosed herein.

With additional reference to FIGS. 2 and 3, in some suitable embodiments, the sloped annular plate or ring 92 from which the plasma and/or gas flow control device 90 is formed has an inner radius r1 measured from, for example, a central vertical axis Z. The inner radius r1 defines and/or establishes an inner edge, periphery and/or circumference 94 of the sloped annular plate or ring 92. Suitably, the inner edge, periphery and/or circumference 94 resides at an upper end of the plasma and/or gas flow control device 90. The sloped annular plate or ring 92 from which the plasma and/or gas flow control device 90 is formed also has an outer radius r2 which is also measured from, for example, the central vertical axis Z. The outer radius r2 defines and/or establishes an outer edge, periphery and/or circumference 96 of the sloped annular plate or ring 92. Suitably, the outer edge, periphery and/or circumference 96 resides at a lower end of the plasma and/or gas flow control device 90, the lower end being opposite the upper end.

In practice, the outer radius r2 is greater than the inner radius r1. In some suitable embodiments, the outer edge, periphery and/or circumference 96 of the sloped annular plate or ring 92 lies within, defines and/or otherwise establishes a lower substantially horizontal plane p1 (for example, substantially normal to the Z axis) at the lower end of the plasma and/or gas flow control device 90; and the inner edge, periphery and/or circumference 94 of the sloped annular plate or ring 92 lies within, defines and/or otherwise establishes an upper substantially horizontal plane p2 (for example, substantially normal to the Z axis) at the upper end of the plasma and/or gas flow control device 90. In some suitable embodiments, the upper plane p2 is off-set by an amount or distance dl (for example, in a direction of the central vertical axis Z) from the lower plane p1. In other words, the inner edge, periphery and/or circumference 94 of the sloped annular plate or ring 92 is not co-planar with the outer edge, periphery and/or circumference 96 of the sloped annular plate or ring 92, i.e., the upper end of the plasma and/or gas flow control device 90 is a distance dl (measured along a direction of the central vertical axis Z) away from the lower end of the plasma and/or gas flow control device 90.

In some suitable embodiments, the sloped annular plate or ring 92 from which the plasma and/or gas flow control device 90 is formed generally has the shape of an outer surface of a frustrum, for example, a right frustrum or a parallel truncation of a right circular cone having an axis that is essentially coextensive with the aforementioned central vertical axis Z. Accordingly (for example, as can be seen when viewed in a bisecting cross-section), the sloped annular plate or ring 92 deflects or is angled downward (for example, in a direction of the vertical central axis Z) when progressing radially from the inner edge, periphery and/or circumference 94 of the sloped annular plate or ring 92 toward the outer edge, periphery and/or circumference 96 of the sloped annular plate or ring 90.

In practice, when the semiconductor wafer W is placed atop and/or secured to mounting platform 22, the substantially planar back side or surface BS of the semiconductor wafer W is: (a) raised by an amount and/or distance (for example, measured in the direction of the Z axis) from the upper end of the plasma and/or gas flow control device 90, i.e., from the plane p2; and (b) substantially parallel to the planes p1 and/or p2. In some suitable embodiments, the sloped annular plate or ring 92 is angled downwardly from the plane p2 by an angle θ (or, equivalently, is angled upwardly from the plane p1 by the angle θ). Suitably, the angle θ may be in a range of greater than 0 degrees and less than 90 degrees. Alternatively, the angle θ may be in a range of greater than about 30 degrees and less than about 60 degrees.

In some suitable embodiments, the difference between r2 and r1 (i.e., r2 minus r1) may be in a range of greater than about 0.1 cm and less than about 550 cm. Advantageously, the aforementioned range in the difference for r2 minus r1, provides flexibility in specifying the dimensions of the flow control device 90 to suitably accommodate a wide array differently sized process chambers 20 and/or differently sized mounting platforms 22, such that the plasma and/or gas flow control device 90 suitably extends between and/or otherwise fills a gap between an outer diameter of the platform 22 and the side wall 20a of the chamber 20 for any number of different combinations of process chambers 20 having varying dimensions and mounting platforms 22 having varying dimensions.

In some suitable embodiments, dl is greater than about 0.1 cm. Further, in some suitable embodiments a width w1 of the sloped annular plate or ring 92 (for example, measured in a direction along the sloping surface) is greater than the difference between r2 and r1 (i.e., w1>r2−r1).

In some suitable embodiments, the sloped annular plate or ring 92 may be made of an electrically conductive material, a semiconductor material, a dielectric material, or another material. In some embodiments, the sloped annular plate or ring 92 may be made of doped or undoped silicon. In still other embodiments, the sloped annular plate or ring 92 may be made of any one or more of variety of materials, including, for example, without limitation: yttrium oxyfluoride (YOF), aluminum (Al), ceramic, perfluoroalkoxy alkanes (PFA), yttrium oxide ($Y_2O_3$), silicon carbide (SiC), quartz, etc. In some embodiments, the plasma and/or gas flow control device 90 and/or the sloped annular plate or ring 92 may be either electrically coupled to the second lower electrode, or alternatively, be electrically isolated from the second lower electrode.

With reference to FIG. 3, in some suitable embodiments, the sloped annular plate or ring 92 is perforated to allow a flow of plasma, exhaust gas and/or the like therethrough. FIG. 3 diagrammatically illustrates a top plan view of the plasma and/or gas flow control device 90. Insets A and B of FIG. 3 show enlargements and/or a magnification of a region A. According to some suitable embodiments disclosed herein, the insets diagrammatically illustrate exemplary configurations of perforations and/or through holes 98 arranged in the sloped annular plate and/or ring 92 forming the plasma and/or gas flow control device 90. As shown in insets A and B of FIG. 3, a plurality of perforations and/or through holes 98 may be formed in the sloped annular plate or ring 92. In the embodiment shown in inset A of FIG. 3, the perforations 98 take the form of radially elongated slits. In the embodiment shown in inset B of FIG. 3, the perforations 98 take the form of substantially circular through holes. It is to be appreciated however that other arrangements and/or shapes of perforations are contemplated to allow a suitable flow of a plasma and/or gas through the sloped annular plate and/or ring 92; and the arrangements and shapes of the perforations 98 illustrated in insets A and B of FIG. 3 are merely examples and some embodiments disclosed herein are not intended to be so limited. In some suitable embodiments, the perforations and/or through holes 98 within the sloped annular plate and/or ring 92 may be so arranged therein and/or shaped to exhibit radial symmetry (for example, with respect to the central vertical axis Z). and/or mirror symmetry (for example, with respect to a bisecting vertical plane).

Figure 4:
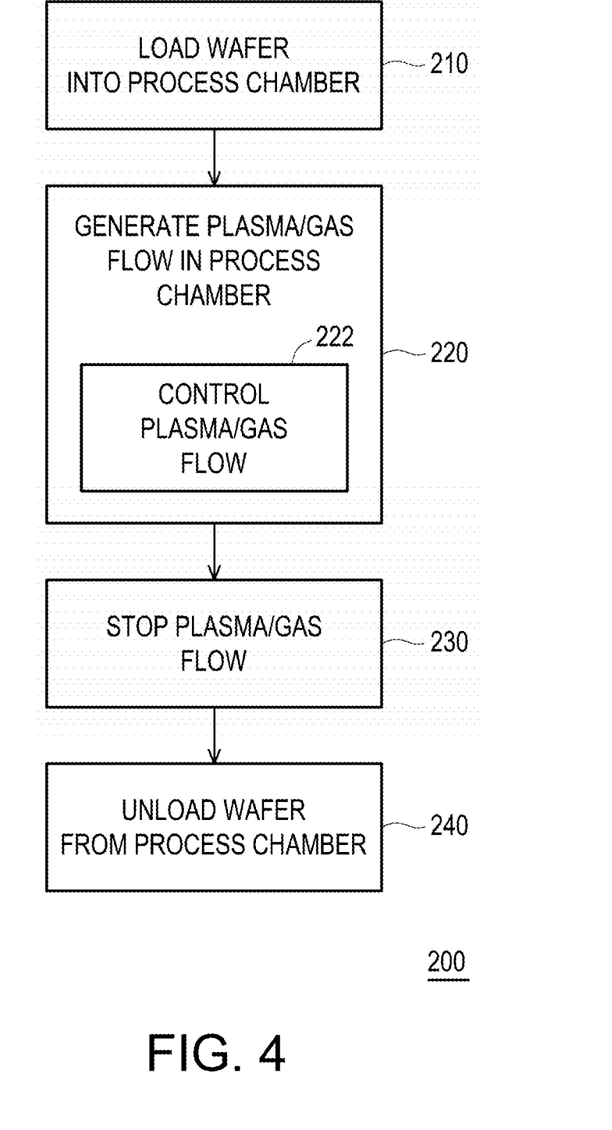
FIG. 4 is a flow chart showing a method of plasma etching a semiconductor wafer in accordance with some embodiments disclosed herein.

In accordance with some embodiments disclosed herein, the flow chart of FIG. 4 shows a method and/or process 200 for applying a plasma treatment, for example, such as etching or the like, to a semiconductor wafer, for example, using the semiconductor manufacturing tool 10.

As shown, the process begins with a step 210 of loading the semiconductor wafer W into the process chamber 20 of the semiconductor manufacturing tool 10. In some suitable embodiments, automated wafer handling equipment, for example, an equipment front end module (EFEM) including a robotic arm or the like, places the semiconductor wafer W atop the mounting platform 22 on its back side surface BS and the electrostatic, vacuum or others suitable chuck is engaged to secure the semiconductor wafer W to the mounting platform 22. Suitably, after the semiconductor wafer W has been positioned on and/or secured to the mounting platform, a vacuum or other relatively low pressure environment is created and/or established in the process chamber 20. For example, the vacuum pump 80 may be employed to pump out and/or otherwise evacuate the air and/or ambient gas from the process chamber thus completing the wafer loading process. In some embodiments, the controller 100 coordinates and/or regulates operation of the automated wafer handling equipment, chuck and/or pump 80 to achieve the forgoing, for example, ensuring that each operation and/or function is carried out in a desired fashion and/or in a designated order or with appropriate timing.

In a next step 220, a plasma and/or gas flow is generated within the process chamber 20. In practice, one or more etchants and/or carrier gases may be introduced to the process chamber 20. For example, these may be supplied from the respective supplies 40 and/or 50 of the delivery system 30 via suitable control of the valves 44 and/or 54 and/or the controlled inlet 32 such that a desired combination or mixture of one or more of the etchants and/or carrier gas (collectively referred to at times as simply the process gas) is delivered, for example, via the manifold 34, to the inlet port or showerhead 60 of the semiconductor manufacturing tool 10. Accordingly, as diagrammatically represented in FIG. 1 by the arrows 62, the delivered process gas is injected, sprayed, showered or otherwise introduced into the process chamber 20. In some suitable embodiments, the process gas may be introduced to the process chamber 20 at a pressure in a range of about 1 torr to about 760 torr. In some suitable embodiments, the process gas may be introduced to the process chamber 20 at a flow rate in a range of about 1 sccm (standard cubic centimeter per minute) to about 1000 sccm.

In some suitable embodiments, the RF generators 72 and/or 76 are selectively operated to energize the respective electrodes 70 and 74 in order to ignite and/or excite the process gas into a plasma and/or create a desired plasma and/or gas flow through the process chamber 20. See, for example FIG. 1, where a plasma field and/or flow is diagrammatically represented by element 78.

In some suitable embodiments, the vacuum pump 80 may also be engaged to further encourage and/or aid in producing a suitable plasma and/or gas flow through the process chamber 20. For example, as represented diagrammatically in FIG. 1 by arrows 82, the plasma and/or gas flow is drawn or otherwise directed through the perforations 98 (see FIG. 3) in the sloped annular plate and/or ring 92 of the plasma and/or gas flow control device 90 and the exhaust is expelled from the process chamber 20, for example, via the vacuum pump 80.

In practice, during the plasma etching and/or other like treatment of the semiconductor wafer W certain unwanted or undesired particles or contaminates (for example, etch products) can be created and/or otherwise introduced in the process chamber 20 where the process is being performed on the semiconductor wafer W. Hence, in a sub-step 222, performed concomitantly with the step 220, the annular plate and/or ring 92 operates to control the plasma and/or gas flow to reduce the likelihood or incidence of such particles, contaminates and/or etch products reaching the surface of the semiconductor wafer W. Significantly, one advantage of the downward sloping angle θ of the annular plate and/or ring 92 is that it aids in limiting the deflection of etch products and/or other unwanted particles or contaminants back along a path towards the device side or surface DS of the semiconductor wafer W, where they run the risk of landing and/or being retained, thereby potentially damaging or causing defects in the semiconductor wafer W being plasma etched or otherwise processed in the process chamber 20. That is to say, to the extent that etch products and/or other unwanted contaminates are deflected by the annular plate or ring 92 as the plasma and/or gas flows through the perforations 98, the downwardly sloping angle θ of the annular plate and/or ring 92 tends to direct these deflected etch products, particles and/or contaminate along a path that does not end with them landing and/or being retained on the device side or surface DS of the semiconductor wafer W.

In some embodiments, the controller 100 coordinates and/or regulates operation of the valves 44 and/or 54, the controlled inlet 32 the RF generators 72 and/or 76 and/or the vacuum pump 80 to achieve the forgoing, for example, ensuring that each operation and/or function is carried out in a desired fashion and/or in a designated order or with appropriate timing.

After the semiconductor wafer W has been exposed to the plasma treatment in the process chamber for a suitable duration, the plasma generation and/or flow may be ceased, as shown in step 230. For example, the valves 44 and 54 may be closed and/or the controlled inlet 32 may be operated (for example, under the control of the controller 100) to stop further delivery of the etchants while continuing flow of the carrier gas (or introducing a dedicated purge gas) to the process chamber 20 to perform a purge of the chamber 20, and/or the electrodes 70 and/or 74 may be de-energized (for example, by suitable control of the RF generators 72 and/or 76 via the controller 100). In some suitable embodiments, the vacuum pump 80 may continue to operate for some suitable duration thereafter to evacuate or otherwise remove any residual plasma, process gas and/or exhaust from the process chamber 20 after the treatment of the semiconductor wafer W has effectively ended, and then the chamber 20 may be brought up to atmospheric pressure or up to the pressure of an associated load lock (not shown) via which the wafer is removed after the processing. In some embodiments, the controller 100 coordinates and/or regulates operation of the valves 44 and/or 54, the controlled inlet 32 the RF generators 72 and/or 76 and/or the vacuum pump 80 to achieve the forgoing, for example, ensuring that each operation and/or function is carried out in a desired fashion and/or in a designated order or with appropriate timing.

After the etching or other like treatment process has ended, the semiconductor wafer W may be unloaded and/or removed from the process chamber 20, for example, as shown at step 240. For example, the chuck of the mounting platform 22 may be disengaged to free the semiconductor wafer W therefrom. In some suitable embodiments, automated wafer handling equipment may accordingly then pick-up the freed semiconductor wafer W from atop the mounting platform 22 and remove it from the process chamber 20.

Figure 5:
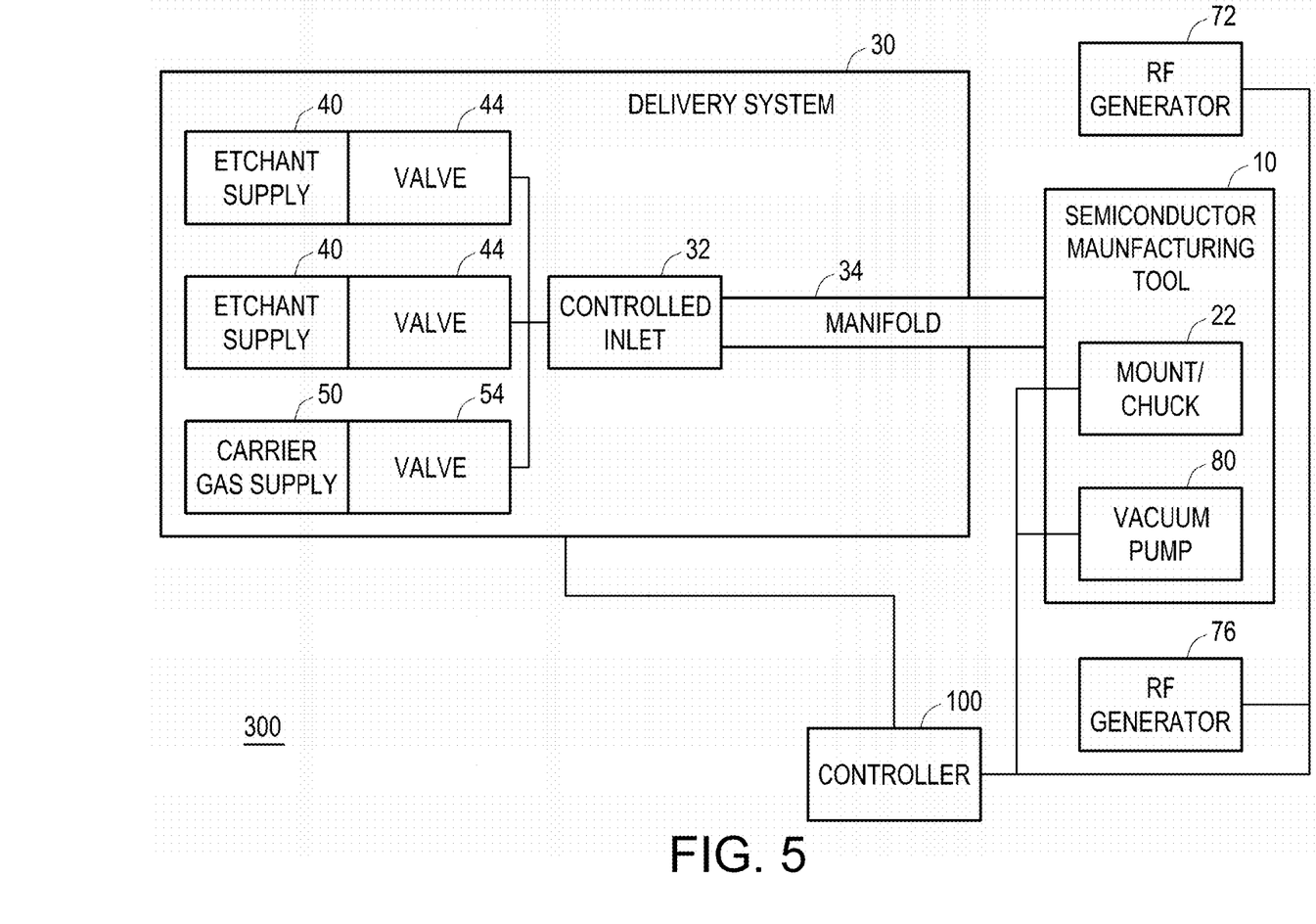
FIG. 5 diagrammatically illustrates a semiconductor processing system employing the semiconductor manufacturing tool of FIG. 1, in accordance with some suitable embodiments disclosed herein.

In accordance with some suitable embodiments disclosed herein, FIG. 5 diagrammatically illustrates a semiconductor processing system 300, for example, incorporating and/or employing the semiconductor manufacturing tool 10 and delivery system 30 shown in FIG. 1. As shown, the controller 100 regulates and/or coordinates operation of the various elements and/or components of the manufacturing tool 10 (for example, the mounting platform 22 and/or vacuum pump 80), the delivery system 30 (for example, the valves 44 and/or 54 and/or the controlled inlet 32), and/or the RF generators 72 and/or 76. In practice, the controller 100 may regulate and/or coordination the operation of the respective elements and/or components to carry out the method and/or process 200 shown in FIG. 4.

In some embodiments, the controller 100 may be implemented via hardware, software, firmware or a combination thereof. In particular, one or more controllers may be embodied by processors, electrical circuits, computers and/or other electronic data processing devices that are configured and/or otherwise provisioned to perform one or more of the tasks, steps, processes, methods and/or functions described herein. For example, a processor, computer, server or other electronic data processing device embodying a controller may be provided, supplied and/or programmed with a suitable listing of code (for example, such as source code, interpretive code, object code, directly executable code, and so forth) or other like instructions or software or firmware, such that when run and/or executed by the computer or other electronic data processing device one or more of the tasks, steps, processes, methods and/or functions described herein are completed or otherwise performed. Suitably, the listing of code or other like instructions or software or firmware is implemented as and/or recorded, stored, contained or included in and/or on a non-transitory computer and/or machine readable storage medium or media so as to be providable to and/or executable by the computer or other electronic data processing device. For example, suitable storage mediums and/or media can include but are not limited to: floppy disks, flexible disks, hard disks, magnetic tape, or any other magnetic storage medium or media, CD-ROM, DVD, optical disks, or any other optical medium or media, a RAM, a ROM, a PROM, an EPROM, a FLASH-EPROM, or other memory or chip or cartridge, or any other tangible medium or media from which a computer or machine or electronic data processing device can read and use. In essence, as used herein, non-transitory computer-readable and/or machine-readable mediums and/or media comprise all computer-readable and/or machine-readable mediums and/or media except for a transitory, propagating signal.

In general, any one or more of the particular tasks, steps, processes, methods, functions, elements and/or components described herein may be implemented on and/or embodiment in one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. In general, any device, capable of implementing a finite state machine that is in turn capable of implementing the respective tasks, steps, processes, methods and/or functions described herein can be used.

The plasma and/or gas flow control device 90 (also referred to as an exhaust ring) comprising the perforated and sloped annular plate or ring 92 is illustrated in FIG. 1 installed in the process chamber 20, and is shown in isolation in FIGS. 2 and 3. In a variant embodiment, the plasma and/or gas flow control device 90 of FIGS. 2 and 3 can be provided as a chamber plasma/gas flow kit for installation in a process chamber, for example to retrofit an existing process chamber with the plasma and/or gas flow control device 90 to provide improved gas/plasma flow that reduces the likelihood or incidence of contaminates and/or etch products reaching the surface of the semiconductor wafer W during plasma processing of a semiconductor wafer using the chamber. Such a chamber plasma/gas flow kit may, for example, comprise the perforated and sloped annular plate or ring 92 along with mounting hardware (not shown) for securing the perforated and sloped annular plate or ring 92 in the chamber as for example shown in FIG. 1.

In the following, some further illustrative embodiments are described.

In some embodiments, a method of plasma etching a semiconductor wafer is provided. It includes: securing the semiconductor wafer to a mounting platform within a process chamber such that an outer edge of the semiconductor wafer is encircled by a sloped annular ring having a plurality of perforation therein, the sloped annular ring having an inner edge at a first end of the sloped annular ring and an outer edge at a second end of the sloped annular ring. Suitably, the first end is opposite the second end and the first end resides in a first plane and the second end resides in a second plane different from the first plane. The method further includes; generating a plasma within the process chamber such that the semiconductor wafer is exposed to the plasma; and creating a flow of at least one of plasma and gas through the perforations in the sloped annular ring.

In some further embodiments, the sloped annular ring has a surface that is slanted away from the first plane by an angle in a range of between greater than 0 degrees and less than 90 degrees.

In still additional embodiments, the inner edge has a first radius measured from a central axis of the sloped annular ring and the outer edge has a second radius measured from the central axis, the second radius being greater than the first radius.

In some embodiments, a difference between the second radius and the first radius is in a range of between greater than or equal to 0.1 cm and less than or equal to 550 cm.

In yet further embodiments, a distance between the first plane and the second plane is greater than or equal to 0.1 cm.

In some further embodiments, the semiconductor wafer has a device side on which semiconductor device structures are formed and a back side opposite the device side, the back side facing the mounting platform when secured thereto.

In some embodiments, when the semiconductor wafer is secured to the mounting platform, the back side is offset from the first plane by a distance, and the first plane is located between the second plane and the semiconductor wafer.

In yet further embodiments, the plurality of perforations exhibits at least one of radial and mirror symmetry within the sloped annular ring.

In some embodiments, generating the plasma includes introducing a process gas into the process chamber, and exciting the process gas into a plasma.

In some further embodiments, exciting the process gas includes energizing an electrode with a radio frequency generator, the electrode being arranged within the process chamber at a location proximate to where the process gas is introduced into the process chamber.

In still further embodiments, creating the flow includes operating a vacuum pump operatively coupled to the process chamber on a side of the sloped annular ring opposite the semiconductor wafer.

In yet additional embodiments, a tool for processing a semiconductor wafer includes: a process chamber; a mounting platform configured to have the semiconductor wafer selectively secured, the mounting platform being housed in the process chamber; an inlet port through which a process gas is introduced into the process chamber; a first electrode that is selectively energized to excite the process gas within the process chamber into a plasma; and an annular plate having a plurality of perforations therein, the annular plate being housed within the process chamber, Suitably, the annular plate encircles an outer edge of the semiconductor wafer when the semiconductor wafer is secured to the mounting platform; the annular plate has a first edge at a first end thereof and a second edge at a second end thereof, the first end being opposite the second end; the first end resides in a first plane and the second end resides in a second plane different from the first plane, the first plane being located above the second plane and below or coplanar with the semiconductor wafer when the semiconductor wafer is secured to the mounting platform; and the first edge has a first radius measured from a central axis of the annular plate and the second edge has a second radius measured from the central axis, the second radius being greater than the first radius.

In some further embodiments, the tool further includes a vacuum pump operatively coupled to the process chamber on a side of the annular plate opposite the semiconductor wafer when the semiconductor wafer is secured to the mounting platform.

In some additional embodiments, the tool further includes a second electrode that is selectively energizable, the first electrode and the second electrode being on opposite sides of the annular plate with respect to one another.

In some embodiments, the annular plate has a surface that extends between the first and second edges thereof, the surface being inclined away from the first plane by an angle in a range of between greater than 0 degrees and less than 90 degrees.

In some embodiments, a difference between the second radius and the first radius is in a range of between greater than or equal to 0.1 cm and less than or equal to 550 cm.

In some further embodiments, a distance between the first plane and the second plane is greater than or equal to 0.1 cm.

In still further embodiments, the semiconductor wafer has a device side on which semiconductor device structures are formed and a back side opposite the device side, the back side facing the mounting platform when secured thereto, and when the semiconductor wafer is secured to the mounting platform, the back side is offset from the first plane by a distance.

In yet further embodiments, a system for exposing a semiconductor wafer to a plasma is provided. The system includes: a process chamber in which the semiconductor wafer is held while it is exposed to the plasma; a delivery system that provides a process gas to the process chamber, the process gas being selectively excited into the plasma to which the semiconductor wafer is exposed; a radio frequency generator that selectively energizes an electrode to selectively excite the process gas within the process chamber; and a control ring that surrounds a region within the process chamber where the semiconductor wafer is held, the control ring comprising a perforated annular surface extending between a first edge and a second edge. Suitably, the first edge resides in a first plane and the second edge resides in a second plane different from and not co-planar with the first plane, and the annular surface is inclined between the first and second planes.

In still one more embodiment, the system further comprises a controller which at least one of regulates and coordinates operation of at least one of the delivery system and the radio frequency generator.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of plasma etching a semiconductor wafer, said method comprising:
securing the semiconductor wafer to a mounting platform within a process chamber, wherein the mounting platform is encircled by a sloped annular ring having a plurality of perforations therein, said sloped annular ring having an inner edge at an upper end of the sloped annular ring and an outer edge at a lower end of the sloped annular ring, wherein the upper end resides in a first plane and the lower end resides in a second plane different from the first plane, and wherein the upper end of the sloped annular ring is below or coplanar with the semiconductor wafer;
generating a plasma within the process chamber such that the semiconductor wafer is exposed to the plasma; and
creating a flow of at least one of plasma and gas through the perforations in the sloped annular ring and out of the process chamber.

2. The method of claim 1, wherein the sloped annular ring has a surface that is slanted away from the first plane by an angle in a range of between greater than 0 degrees and less than 90 degrees.

3. The method of claim 2, wherein the inner edge has a first radius measured from a central axis of the sloped annular ring and the outer edge has a second radius measured from the central axis, the second radius being greater than the first radius.

4. The method of claim 3, wherein a difference between the second radius and the first radius is in a range of between greater than or equal to 0.1 cm and less than or equal to 550 cm.

5. The method of claim 2, wherein a distance between the first plane and the second plane is greater than or equal to 0.1 cm.

6. The method of claim 1, wherein the semiconductor wafer has a device side on which semiconductor device structures are formed and a back side opposite the device side, said back side facing the mounting platform when secured thereto.

7. The method of claim 6, wherein when the semiconductor wafer is secured to the mounting platform, the back side is offset from the first plane by a distance, and the first plane is located between the second plane and the semiconductor wafer when the semiconductor wafer is secured to the mounting platform.

8. The method of claim 1, wherein the plurality of perforations exhibits at least one of radial and mirror symmetry within the sloped annular ring.

9. The method of claim 1, wherein generating the plasma comprises:
introducing a process gas into the process chamber; and
exciting the process gas into a plasma.

10. The method of claim 9, wherein exciting the process gas comprises:
energizing an electrode with a radio frequency generator, said electrode being arranged within the process chamber at a location proximate to where the process gas is introduced into the process chamber.

11. The method of claim 1, wherein creating the flow comprises:
operating a vacuum pump operatively coupled to the process chamber on a side of the sloped annular ring opposite the semiconductor wafer.

12. A method for processing a semiconductor wafer secured to a mounting platform housed in a process chamber, said method comprising:
via an inlet port, introducing a process gas into the process chamber;
exciting the introduced process gas within the process chamber into a plasma by energizing a first electrode; and
controlling a flow of the introduced process gas using an annular plate having a plurality of perforations therein, said annular plate being housed within the process chamber;
wherein:
the annular plate encircles an outer edge of the semiconductor wafer when the semiconductor wafer is secured to the mounting platform;
the annular plate has a first edge at a first end thereof and a second edge at a second end thereof, said first end being opposite the second end;
the first end resides in a first plane and the second end resides in a second plane different from the first plane, said first plane being located above the second plane and below or coplanar with the semiconductor wafer when the semiconductor wafer is secured to the mounting platform; and
the first edge has a first radius measured from a central axis of the annular plate and the second edge has a second radius measured from the central axis, said second radius being greater than the first radius.

13. The method of claim 12, further comprising:
during introducing of the process gas, operating a vacuum pump operatively coupled to the process chamber on a side of the annular plate opposite the semiconductor wafer.

14. The method of claim 12, wherein the exciting further comprises:
energizing a second electrode, said first electrode and said second electrode being on opposite sides of the annular plate with respect to one another.

15. The method of claim 12, wherein the annular plate has a surface that extends between the first and second edges thereof, said surface being inclined away from the first plane by an angle in a range of between greater than 0 degrees and less than 90 degrees.

16. The method of claim 12, wherein a difference between the second radius and the first radius is in a range of between greater than or equal to 0.1 cm and less than or equal to 550 cm.

17. The method of claim 12, wherein a distance between the first plane and the second plane is greater than or equal to 0.1 cm.

18. The method of claim 12, wherein:
the semiconductor wafer has a device side on which semiconductor device structures are formed and a back side opposite the device side, said back side facing the mounting platform when secured thereto; and
the semiconductor wafer is secured to the mounting platform with the back side of the semiconductor wafer offset from the first plane by a distance.

19. A method for exposing a semiconductor wafer held in a process chamber to a plasma, said method comprising:
providing a process gas to the process chamber, said process gas being selectively excited into the plasma to which the semiconductor wafer is exposed;
using a radio frequency generator, selectively energizing an electrode to selectively excite the process gas within the process chamber; and
controlling flow of the process gas provided to the process chamber using a control ring that surrounds a region within the process chamber where the semiconductor wafer is held, said control ring comprising a perforated annular surface extending between a first edge and a second edge;
wherein:
the first edge resides in a first plane and the second edge resides in a second plane different from and not co-planar with the first plane, said first plane being located above the second plane and below or coplanar with the semiconductor wafer; and the annular surface is inclined between the first and second planes; and the first edge has a first radius measured from a central axis of the annular plate and the second edge has a second radius measured from the central axis, said second radius being greater than the first radius.

20. The method of claim 19, further comprising:

using a controller, at least one of regulating and coordinating operation of at least one of the providing of the process gas to the process chamber and the energizing of the electrode to selectively excite the process gas within the process chamber.

\* \* \* \* \*